(12) United States Patent
Ju

(10) Patent No.: US 6,929,170 B2
(45) Date of Patent: Aug. 16, 2005

(54) SOLDER DEPOSITION METHOD

(76) Inventor: Ted Ju, No. 15, Wu Shiunn St., An Leh District, Keelung City (TW)

( * ) Notice: Subject to any disclaimer, the term of this patent is extended or adjusted under 35 U.S.C. 154(b) by 13 days.

(21) Appl. No.: 10/673,237

(22) Filed: Sep. 30, 2003

(65) Prior Publication Data
US 2005/0067470 A1 Mar. 31, 2005

(51) Int. Cl.$^7$ .............................................. B23K 31/02
(52) U.S. Cl. ..................... 228/245; 228/170; 228/179.1
(58) Field of Search ................................ 228/245–254, 228/179.1–180.22, 170, 173.6; 438/613; 257/737–738

(56) References Cited

U.S. PATENT DOCUMENTS

| | | | | |
|---|---|---|---|---|
| 5,184,767 A | * | 2/1993 | Estes ........................ | 228/56.3 |
| 5,735,452 A | * | 4/1998 | Yu et al. ..................... | 228/254 |
| 5,954,262 A | * | 9/1999 | Inoue et al. ................ | 228/245 |
| 6,249,963 B1 | * | 6/2001 | Chou et al. ................ | 29/843 |
| 6,279,814 B1 | * | 8/2001 | Inoue et al. ........... | 228/180.21 |
| 2003/0193094 A1 | * | 10/2003 | Takahashi et al. .......... | 257/780 |
| 2004/0135251 A1 | * | 7/2004 | Tellkamp et al. ............ | 257/738 |

FOREIGN PATENT DOCUMENTS

| JP | 405291260 A | * | 11/1993 |
|---|---|---|---|
| JP | 06045740 A | * | 2/1994 |
| JP | 09326552 A | * | 12/1997 |
| JP | 410125684 A | * | 5/1998 |

* cited by examiner

Primary Examiner—Kiley S. Stoner
(74) Attorney, Agent, or Firm—Varndell & Varndell, PLLC

(57) ABSTRACT

A solder deposition method according to the present invention comprises the steps of: (1) providing a solder slab; (2) providing a complementary means having a plurality of through holes; (3) providing a circuit element, which is composed of an insulating body and a plurality of embedded conducting terminals; (4) placing the circuit element under the complementary means and the solder slab above the complementary means, and injecting a plurality of solder bits taken from the solder slab by a punching device through the complementary means into the solder-retaining units of the conducting terminals. This method is advantageous in the simplicity of soldering instrumentation and process, which significantly reduces production costs.

9 Claims, 7 Drawing Sheets

SOLDER DEPOSITION METHOD

BACKGROUND OF THE INVENTION (a) Field of the Invention

The present invention relates to solder deposition methods, and more particularly to a solder deposition method by which solder is punched onto the solder joints of circuit elements.

(b) Description of the Prior Art

In the prior art, integrated circuit elements are mounted on a circuit board by the method of BGA (ball grid array), in which the solder joints of the integrated circuit elements are firstly applied with a layer of solder binder. Solder balls are then attached to the solder joints by the adhesive effect of the solder binder. The circuit board with the integrated circuit elements attached with solder balls is heated at a high time temperature, which melts the solder balls so that the solder is substantially attached on the solder joints. To assure that each solder joint of the circuit elements is in conductive contact with the circuit board, the solder balls each have to cover a large enough area after being melted, which requires high uniformity in the size and the shape of the solder balls. This is a disadvantage of the deposition method using solder balls, since the storage and transportation of the solder balls consume much more time, and the production cost is high.

SUMMARY OF THE INVENTION

The primary objective of the present invention is to provide a easily operable, low-cost solder deposition method for manufacturing integrated circuit boards.

The solder deposition method according to the present invention comprises the steps of: (1) providing a solder slab; (2) providing a complementary means on which there are a plurality of through holes; (3) providing a circuit element, which is composed of an insulating body and a plurality of embedded conducting terminals; (4) placing the circuit element under the complementary means and the solder slab above the complementary means, and injecting a plurality of solder bits produced from the solder slab through the complementary means into the solder-retaining units of the conducting terminals by a punching device.

Compared with the solder deposition methods of the prior art, the present invention utilizes a complementary means to deposit solder material into retaining units of an electronic circuit element and assure proper connection between the solder material and the solder joints. It therefore overcomes the soldering defect problem in the conventional methods that adapt solder balls. The present invention is further advantageous in the simplicity of soldering instrumentation and process, which significantly reduces production costs.

The various objects and advantages of the present invention will be more readily understood from the following detailed description when read in conjunction with the appended drawings.

DETAILED DESCRIPTION OF THE PREFERRED EMBODIMENTS

Figure 1:
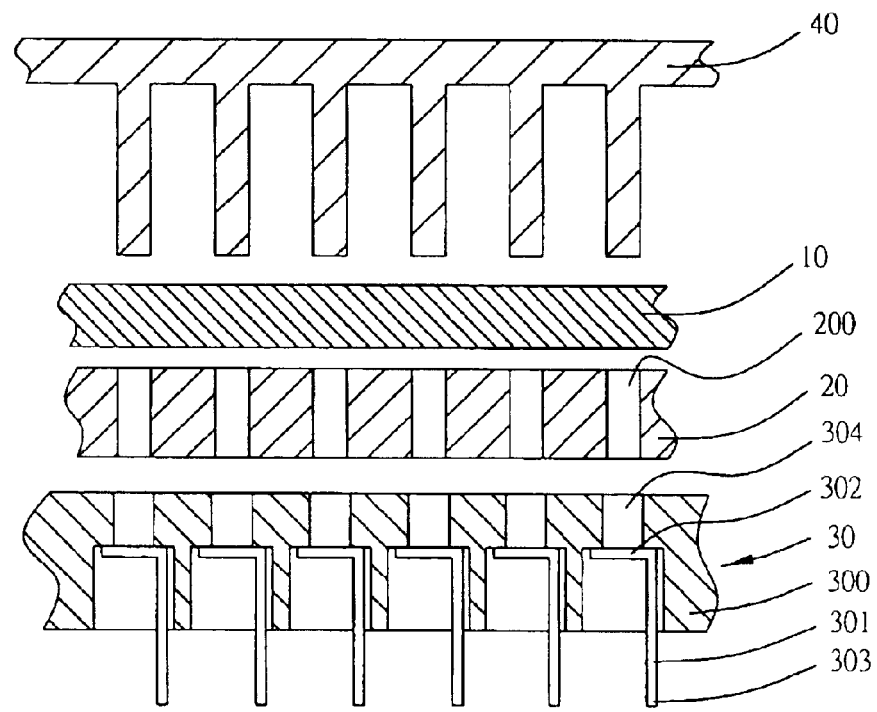
FIG. 1 is a cross-sectional view of the first preferred embodiment according to the present invention before solder is deposited.
Figure 2:
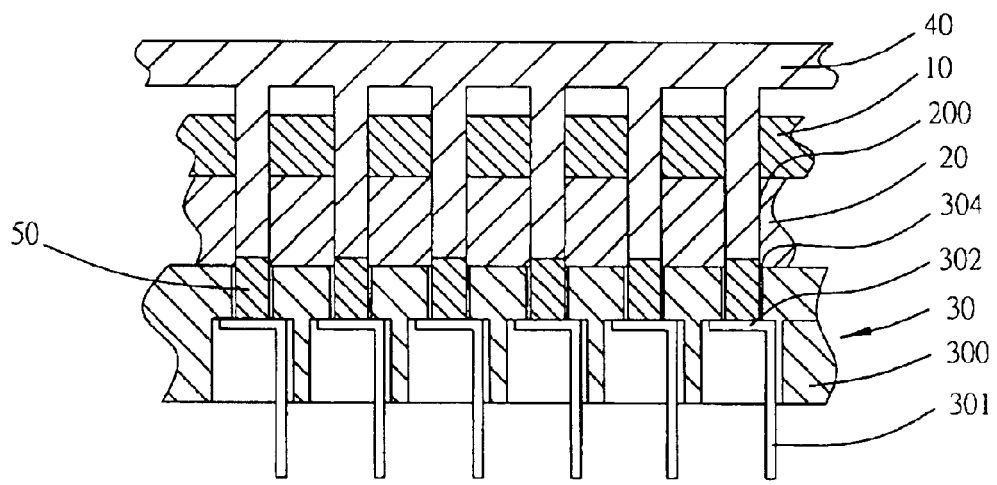
FIG. 2 is a cross-sectional view of the first preferred embodiment according to the present invention after solder is deposited.

Referring to FIGS. 1 and 2, the solder deposition method according to the present invention comprises the steps of:

(1) A solder slab 10 is provided;

(2) A complementary means 20 is provided, and the means 20 has a plurality of through holes 200.

(3) A circuit element 30 is provided, which is an interconnect pad in this preferred embodiment and composed of an insulating body 300 and a plurality of conducting terminals 301 embedded in the insulating body 300. Each of the conducting terminals 301 has a solder joint 302 at one end for solder-connecting another integrated electronic device, such as a circuit board, and a contact terminal 303 for connecting another circuit element, not shown in the figures. A plurality of solder-retaining units 304 is formed at the bottom of the insulating body 300, which are through holes 304 in this preferred embodiment.

(4) The circuit element 30 is located under the complementary means 20. The solder slab 10 is placed above the complementary means 20, and a force is applied to the solder slab 10 by using a punching means 40 in this preferred embodiment so as to inject a plurality of solder bits 50 produced from the solder slab 10 the through holes 200 on the complementary means 20 into the solder-retaining units 304.

Figure 3:
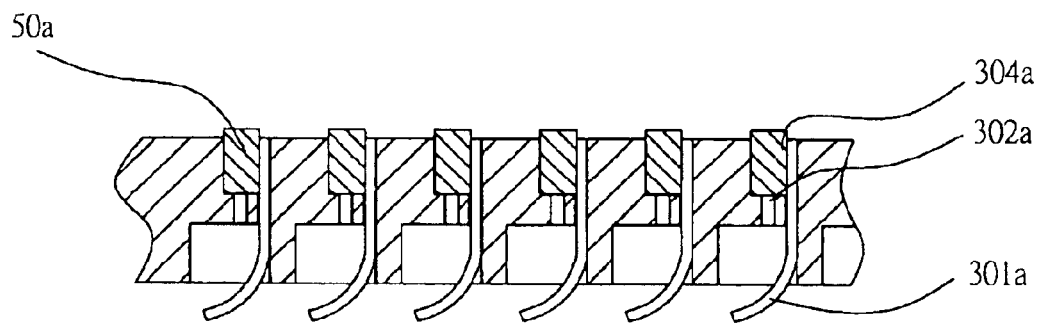
FIG. 3 is a cross-sectional view of the circuit element of the second preferred embodiment according to the present invention.

Referring to FIG. 3, the second preferred embodiment according to the present invention differs from the first preferred embodiment in that the solder-retaining units 304 for the solder bits 50a are retaining cavities 304a each defined by the solder joint 302a of a conducting terminal 301 and a corresponding through hole on the insulating body. The retaining cavities 304a house the solder bits 50a and at the same time connect the solder joints 302a.

Figure 4:
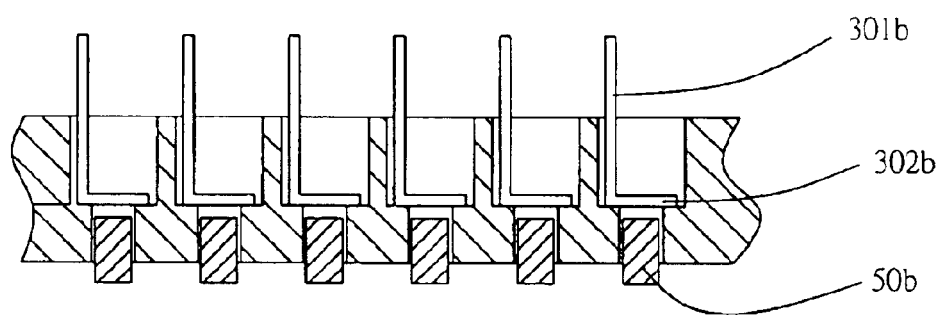
FIG. 4 is a cross-sectional view of the circuit element of the third preferred embodiment according to the present invention.
Figure 5:
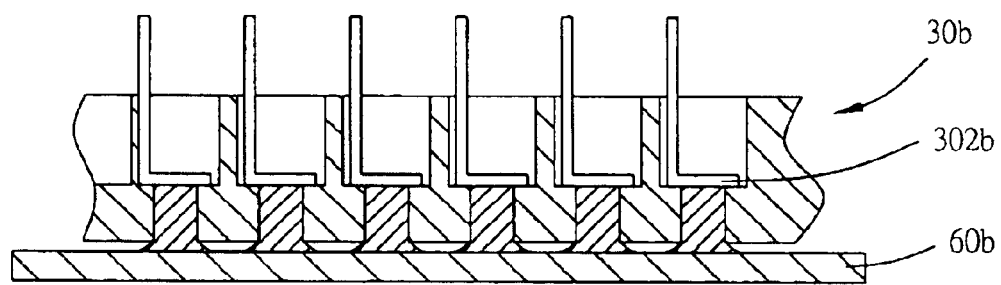
FIG. 5 is a cross-sectional view of the circuit element in FIG. 4 being soldered onto a circuit board.

Referring to FIG. 4, the third preferred embodiment according to the present invention has solder bits 50b which are not in direct contact with the solder joints 302b of the conducting terminals 301b. When the circuit element 30 is connected with a circuit board 60b by a soldering process, the solder bits 50b get heated and melted and therefore connect the solder joints 302b.

Figure 6:
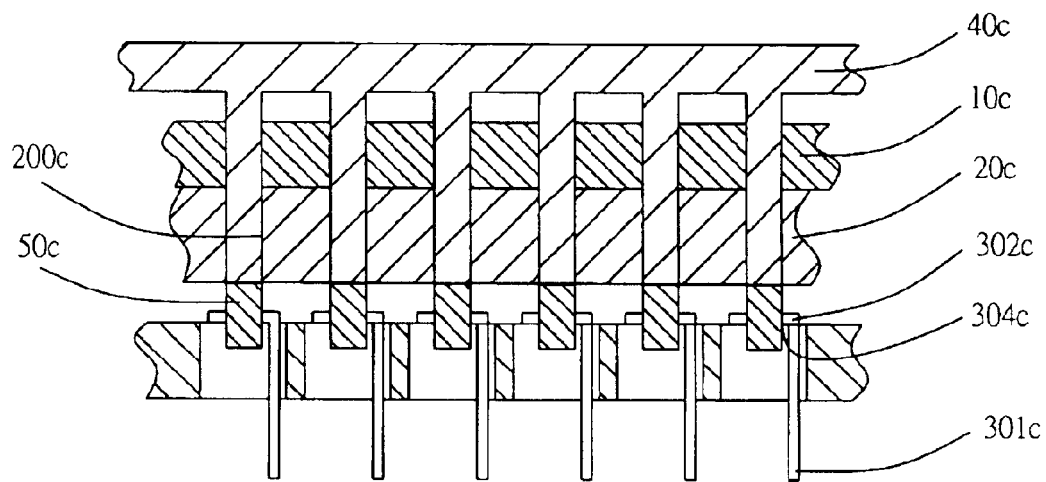
FIG. 6 is a cross-sectional view of the fourth preferred embodiment according to the present invention.
Figure 7:
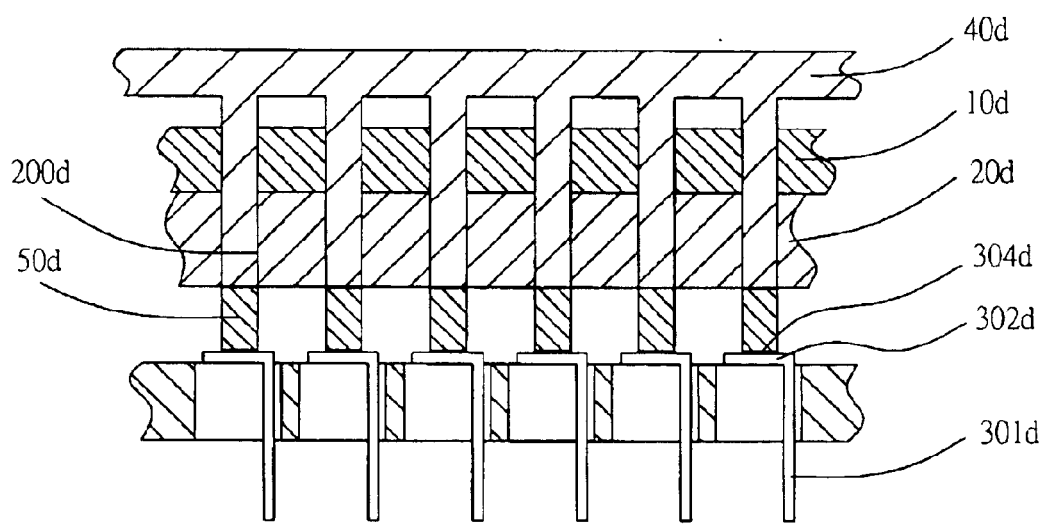
FIG. 7 is a cross-sectional view of the fifth preferred embodiment according to the present invention.
Figure 8:
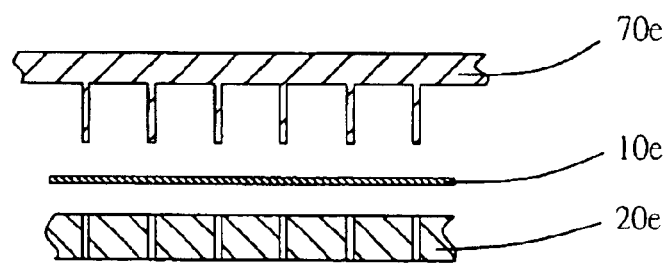
FIG. 8 is a cross-sectional view of the sixth preferred embodiment according to the present invention before the positioning holes are formed.
Figure 9:
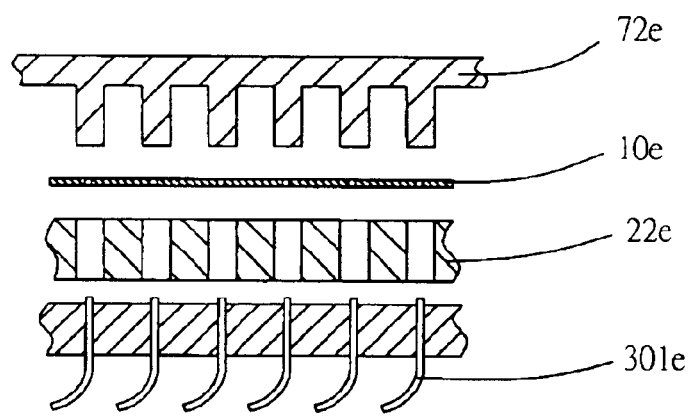
FIG. 9 is a cross-sectional view of the sixth preferred embodiment according to the present invention after the positioning holes are formed and before the solder bits are taken off.
Figure 10:
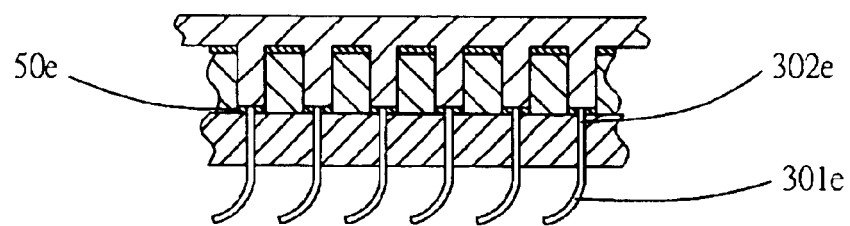
FIG. 10 is a cross-sectional view of the sixth preferred embodiment according to the present invention after the solder bits are taken off.
Figure 11:
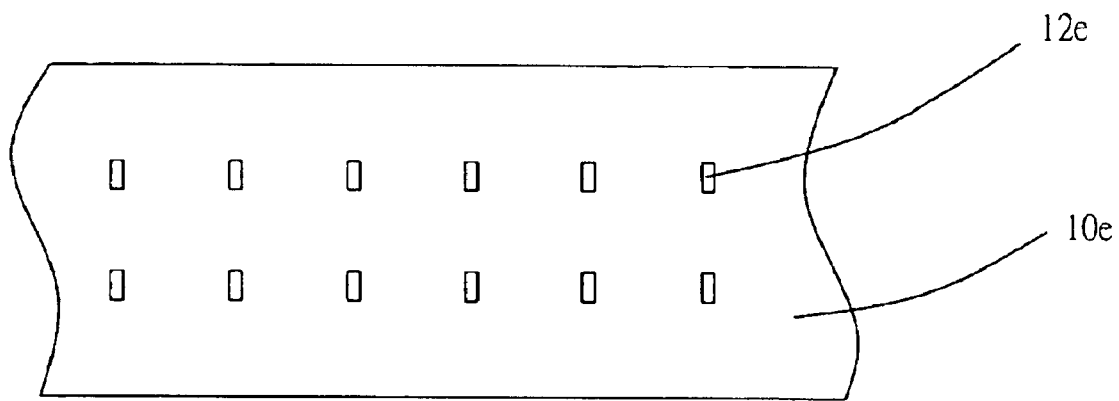
FIG. 11 is a top view of the solder slab of the sixth preferred embodiment according to the present invention after the positioning holes are formed and before the solder bits are taken off.
Figure 12:
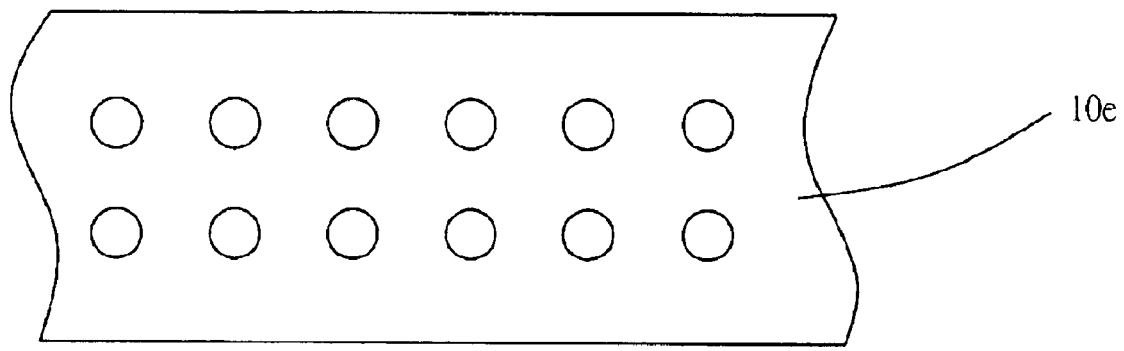
FIG. 12 is a top view of the solder slab of the sixth preferred embodiment according to the present invention after the solder bits are taken off.

Referring to FIG. 6, the fourth preferred embodiment according to the present invention differs from the first preferred embodiment in that the solder-retaining units for the solder bits are holes 304c formed atop the solder joint 302c of the conducting terminals 301c. The solder bits 50c are injected through holes 200c of the complementary means 20c by a punching means 40c and deposited into the holes 304 so as to connect the solder joints 302c.

Referring to FIG. 6, the fifth preferred embodiment according to the present invention differs from the first preferred embodiment in that the solder-retaining units for the solder bits are a layer of solder binder 304d applied to the top surface of each of the solder joints 302d of the conducting terminals 301d. The solder bits 50d are injected through holes 200d of the complementary means 20d by a punching means 40d and attached onto the solder joints 302d by the adhesive effect of the solder binder 304d.

Figure 13:
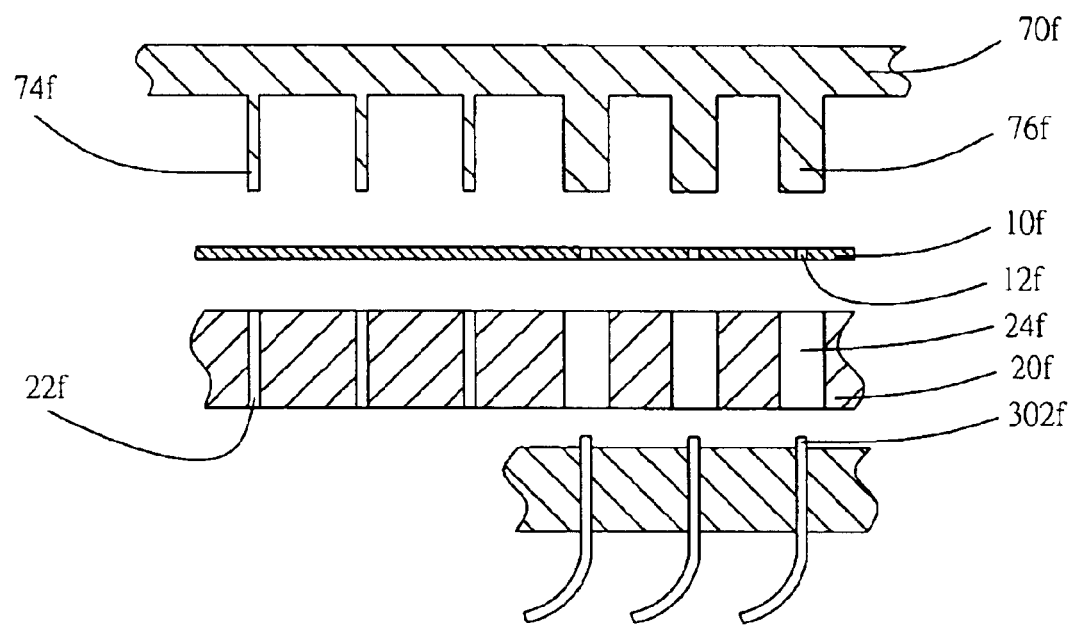
FIG. 13 is a cross-sectional view of the seventh preferred embodiment according to the present invention before the positioning holes are formed and the solder bits are taken off.
Figure 14:
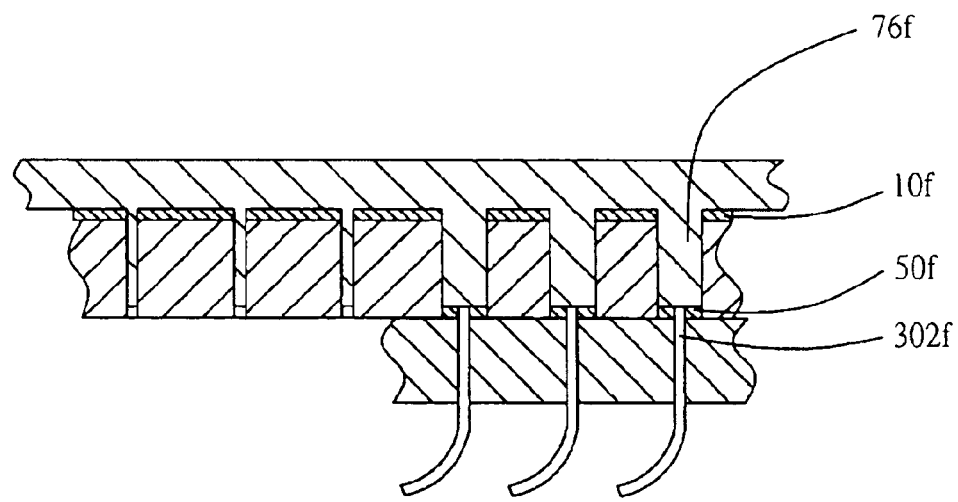
FIG. 14 is a cross-sectional view of the seventh preferred embodiment according to the present invention after the positioning holes are formed and the solder bits are taken off.
Figure 15:
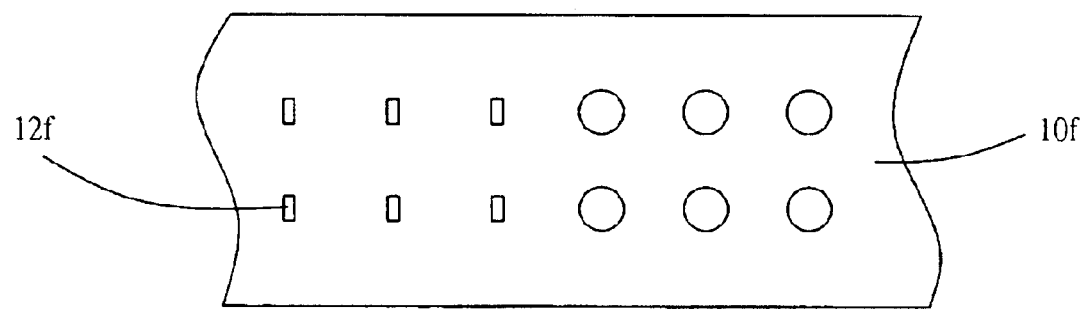
FIG. 15 is a top view of the solder slab of the seventh preferred embodiment according to the present invention after being punched.

In another preferred embodiment of the present invention, the solder-retaining units are the positioning holes provided on solder bits and sharp tips of the solder joints of the conducting terminals. Each of the solder bits is rivet mounted on a corresponding solder joint tip. This can be achieved by one of the following two methods. Referring to FIG. 8 to 12, the first method utilizes a first punch pin 70e and a first complementary means 20e to provide a solder slab 10e with a plurality of small positioning holes 12e. A second punch pin 72e and a second complementary means 22e are then used to inject solder bits 50e produced from the solder slab 10e through the second complementary means 22e onto the pin-like solder joints 302e of the conducting terminals 301e; the solder bits 50e are thus substantially mounted on the solder joints 302e by a riveting effect. Refer to FIG. 13 to 15 for the second method. The complementary means 20f is provided with small first through holes 22f on one side and bigger second through holes 24f on the other side. A punching model has a section of first punch pins 74f corresponding to the first through holes 22f and a section of second punch pins 76f corresponding to the second through holes 24f. The section of first punch pins 74f firstly punches the solder slab 10f to form a plurality of small positioning holes 12f thereon. Secondly, the positioning holes 12f are aligned with the section of second punch pins 76f, the second through holes 24f of the complementary means 20f, and the solder joints 302f. The second punch pins 76f and the complementary means 22f are then used to inject solder bits 50f produced from the solder slab 10f through the second through holes 24f of the complementary means 20f onto the pin-like solder joints 302f; the solder bits 50f are thus substantially mounted on the solder joints 302f by a riveting effect. Therefore, the second method uses a single punch to deposit solder bits onto a circuit element and at the same time to provide the solder slab with positioning holes for the next circuit element, which may enhances the production efficiency.

Figure 16:
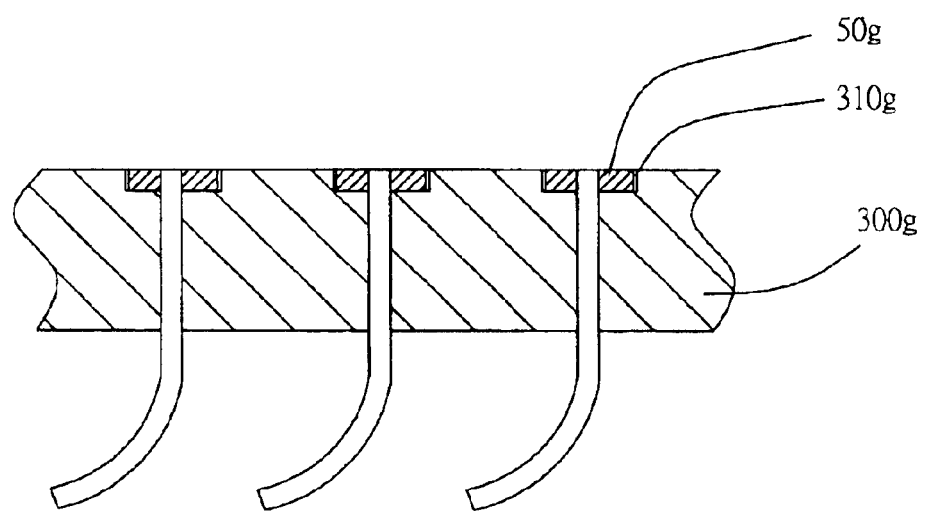
FIG. 16 is a top view of the circuit element of the eighth preferred embodiment according to the present invention.

Referring to FIG. 16, a surface of the insulating body 300g is provided with a plurality of indentations 310g, each around a solder joint 302g for retaining a solder bit 50g.

Compared with the solder deposition methods of the prior art, the present invention utilizes a complementary means to deposit solder material into retaining units of an electronic circuit element and assure proper connection between the solder material and the solder joints. It therefore overcomes the soldering defect problem in the conventional methods that adapt solder balls. The present invention is further advantageous in the simplicity of soldering instrumentation and process, which significantly reduces production costs.

The present invention is thus described, and it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A solder deposition method comprising the steps of:
   providing a solder slab;
   punching a plurality of positioning holes on the solder slab;
   providing a complementary means having a plurality of through holes;
   providing a circuit element composed of an insulating body and a plurality of conducting terminals embedded in the insulating body, each of the conducting terminals having a solder-retaining unit at one end, and one end of the conducting terminals being pin-like and fitting into a positioning hole; and
   placing the circuit element under the complementary means and the solder slab above the complementary means, and injecting a plurality of solder bits taken from the solder slab by a punching device through the complementary means into the solder-retaining units of the conducting terminals.

2. The solder deposition method according to claim 1, wherein the positioning holes are formed by a first punching means, and a plurality of solder bits are taken from the solder slab by a second punching means.

3. The solder deposition method according to claim 1, wherein the positioning holes are formed on the solder slab and a plurality of solder bits are taken from the solder slab by a third punching means; the third punching means is provided with a first punch pin set and a second punch pin set for completing the positioning hole formation and the solder bit departure simultaneously.

4. The solder deposition method according to claim 3, wherein the complementary means has a section of first through holes and a section of second through holes, respectively corresponding to the first punch pin set and the second punch pin set.

5. A solder deposition method comprising the steps of:
   providing a solder slab;
   providing a complementary means having a plurality of through holes;
   providing a circuit element composed of an insulating body and a plurality of conducting terminals embedded in the insulating body, and one end of each of the conducting terminals being a solder joint having a solder-retaining unit for mounting a solder bit, the solder retaining units are being a hole provided at each of the solder joints of the conducting terminals; and placing the circuit element under the complementary means and the solder slab above the complementary means, and injecting a plurality of solder bits taken from the solder slab by a punching device through the complementary means into the solder-retaining units of the conducting terminals.

6. The solder deposition method according to claim 1, wherein one end of each of the conducting terminals is a solder joint having the solder-retaining unit for mounting a solder bit, holes are formed on the insulating body adjacent to the solder joints of the conducting terminals, and the solder-retaining units are cavities defined by the holes and the solder joints.

7. A solder deposition method comprising the steps of:

providing a solder slab;

providing a complementary means having a plurality of through holes;

providing a circuit element composed of an insulating body and a plurality of conducting terminals embedded in the insulating body, and one end of each of the conducting terminals being a solder joint having the solder-retaining unit for mounting a solder bit, the solder-retaining units being holes formed on the insulating body close to the solder joints of the conducting terminals; and placing the circuit element under the complementary, means and the solder slab above the complementary means, and injecting a plurality of solder bits taken from the solder slab by a punching device through the complementary means into the solder-retaining units of the conducting terminals.

8. The solder deposition method according to claim 1, wherein one end of each of the conducting terminals is a solder joint having the solder-retaining unit for mounting a solder bit, and the solder-retaining units are solder binder applied to each of the top surface of the solder joints for adhesively mounting a solder bit.

9. The solder deposition method according to claim 1, wherein one end of each of the conducting terminals is a solder joint having the solder-retaining unit for mounting a solder bit, the solder-retaining units are sharp tips of the solder joints of the conducting terminals and corresponding positioning holes of the solder bits; the solder bits are rivet mounted onto the solder joints through inserting the sharp tips into the positioning holes.

* * * * *